(12) United States Patent
Singer et al.

(10) Patent No.: US 8,134,687 B2
(45) Date of Patent: Mar. 13, 2012

(54) ILLUMINATION SYSTEM OF A MICROLITHOGRAPHIC EXPOSURE APPARATUS

(75) Inventors: Wolfgang Singer, Aalen (DE); Johannes Wangler, Koenigsbronn (DE); Rafael Egger, Munich (DE); Wilhelm Ulrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 924 days.

(21) Appl. No.: 11/660,754

(22) PCT Filed: Aug. 23, 2005

(86) PCT No.: PCT/EP2005/009093
§ 371 (c)(1),
(2), (4) Date: Nov. 19, 2007

(87) PCT Pub. No.: WO2006/021419
PCT Pub. Date: Mar. 2, 2006

(65) Prior Publication Data
US 2008/0212327 A1 Sep. 4, 2008

Related U.S. Application Data

(60) Provisional application No. 60/603,772, filed on Aug. 23, 2004.

(51) Int. Cl.
*G03B 27/54* (2006.01)
*G03B 27/42* (2006.01)
(52) U.S. Cl. .......................................... 355/67; 355/53
(58) Field of Classification Search .................. 355/52, 355/53, 55, 67–71, 354–359
See application file for complete search history.

(56) References Cited

U.S. PATENT DOCUMENTS

| | | | |
|---|---|---|---|
| 804,996 A | 11/1905 | Anthony | |
| 1,085,795 A | 2/1914 | Boyle | |
| 1,988,946 A | 5/1933 | Hauser et al. | |
| 2,198,014 A | 7/1937 | Oh | |
| 3,501,626 A | 3/1970 | Bernard | |
| 3,689,760 A | 9/1972 | George, Jr. | |
| 3,817,605 A | 6/1974 | Franklin et al. | |
| 4,317,613 A | 3/1982 | Grosser | |
| 4,657,360 A | 4/1987 | Izukawa et al. | |
| 4,674,845 A | 6/1987 | Matsumura | |
| 4,997,250 A | 3/1991 | Ortiz, Jr. | |
| 5,382,999 A * | 1/1995 | Kamon | 355/53 |
| 5,572,287 A | 11/1996 | Wangler et al. | |
| 5,629,805 A | 5/1997 | Fukuzawa | |
| 5,675,401 A | 10/1997 | Wangler et al. | |

(Continued)

FOREIGN PATENT DOCUMENTS

DE 585700 7/1933

(Continued)

*Primary Examiner* — Hung Henry Nguyen
(74) *Attorney, Agent, or Firm* — Sughrue Mion, PLLC

(57) ABSTRACT

An illumination system of a microlithographic exposure apparatus has an optical axis and a beam transforming device. This device includes a first mirror with a first reflective surface having a shape that is defined by rotating a straight line, which is inclined with respect to the optical axis, around the optical axis. The device further includes a second mirror with a second reflective surface having a shape that is defined by rotating a curved line around the optical axis. At least one of the mirrors has a central aperture containing the optical axis. This device may form a zoom-collimator for an EUV illumination system that transforms a diverging light bundle into a collimated light bundle of variable shape and/or diameter.

20 Claims, 11 Drawing Sheets

U.S. PATENT DOCUMENTS

| | | |
|---|---|---|
| 5,757,470 A | 5/1998 | Dewa et al. |
| 6,100,961 A | 8/2000 | Shiraishi et al. |
| 6,285,443 B1 | 9/2001 | Wangler et al. |
| 6,307,682 B1 * | 10/2001 | Hoffman et al. ............... 359/663 |
| 6,377,336 B1 | 4/2002 | Shiraishi et al. |
| 6,452,661 B1 * | 9/2002 | Komatsuda .................... 355/67 |
| 6,452,662 B2 * | 9/2002 | Mulkens et al. ................ 355/67 |
| 6,573,978 B1 | 6/2003 | McGuire, Jr. |
| 6,836,530 B2 | 12/2004 | Singer et al. |
| 6,859,328 B2 | 2/2005 | Schultz et al. |
| 2002/0136351 A1 | 9/2002 | Singer |
| 2003/0043455 A1 | 3/2003 | Singer et al. |
| 2004/0028175 A1 | 2/2004 | Antoni et al. |
| 2007/0058244 A1 | 3/2007 | Singer |

FOREIGN PATENT DOCUMENTS

| | | |
|---|---|---|
| DE | 10 2004 059 493 A1 | 7/2005 |
| EP | 0 687 956 A1 | 12/1995 |
| EP | 0 747 772 A | 12/1996 |
| GB | 907 679 A | 10/1962 |
| WO | WO 2005/031748 A1 | 4/2005 |

\* cited by examiner

ILLUMINATION SYSTEM OF A MICROLITHOGRAPHIC EXPOSURE APPARATUS

CROSS-REFERENCE TO RELATED APPLICATIONS

This application is the national stage of International Patent Application PCT/EP2005/009093, filed Aug. 23, 2005 and claims the benefit of U.S. Provisional Application 60/603,772, filed Aug. 23, 2004. The full disclosures of these earlier applications are incorporated herein by reference.

BACKGROUND OF THE INVENTION

1. Field of the Invention

The present invention relates generally to illumination systems of microlithographic projection exposure apparatuses. Such apparatuses are used to produce large-scale integrated circuits and other micro-structured components. More particularly, the invention relates to beam transforming devices in such illumination systems that modify the radial energy distribution of the illumination light bundle.

2. Description of Related Art

In the production of micro-structured components, a plurality of structured layers is applied to a suitable substrate, for example a silicon wafer. To structure the layers, these are first covered with a photosensitive resist. The resist is sensitive to light of a particular wavelength range, e.g. light in the deep ultraviolet (DUV) or extreme ultraviolet (EUV) spectral range. The coated wafer is then exposed in a projection exposure apparatus that comprises an illumination system and a projection objective. The illumination system illuminates a mask that contains a pattern of structures to be formed on the wafer. The projection objective images the illuminated structures onto the resist. Since the magnification is generally less than 1, such projection objectives are often referred to as reduction objectives.

After the resist has been developed, the wafer is subjected to an etching or separating process. As a result of this process, the top layer is structured according to the pattern on the mask. The remaining resist is then removed from the other parts of the layer. This process is repeated until all layers are applied to the wafer.

The performance of the projection exposure apparatuses is not only determined by the imaging properties of the projection objective but also by the optical properties of the illumination system that illuminates the mask. The illumination system contains a light source, e.g. a pulsed laser, and a plurality of optical elements which generate a projection light bundle having the desired properties. These properties include the angular distribution of the light rays which form the projection light bundle. If the angular distribution of projection light is specifically adapted to the pattern contained in the mask, this pattern can be imaged with improved image quality onto the wafer covered with the photosensitive resist.

The angular distribution of projection light in the mask plane is often not described as such, but as an intensity distribution in a pupil plane. This exploits the fact that angles formed between the optical axis and light rays passing a field plane correspond to radial distances at which the respective light rays pass a pupil plane. In a so-called conventional illumination setting, for example, the region illuminated in such a pupil plane is a circular disc which is concentric with the optical axis. At each point in the field plane, light rays therefore impinge with angles of incidence between 0° and a maximum angle determined by the radius of the circular disc.

In so-called non-conventional illumination settings, e.g. ring field, dipole or quadrupole illuminations, the region illuminated in the pupil plane has the shape of a ring which is concentric with the optical axis, or a plurality of separate areas arranged off the optical axis. In these non-conventional illumination settings, only oblique rays illuminate the mask.

To generate an angular distribution of projection light that is optimally adapted to the mask, DUV illumination systems often employ an optical raster element, which can be for example a diffractive optical element (DOE) or a microlens array. Further examples of such raster elements are described in U.S. Pat. No. 6,285,443 assigned to the applicant. When changing between different illumination settings, e.g. from a conventional setting to a quadrupole setting, it is generally necessary to change the optical raster element. For fine tuning the angular distribution of illumination, and also to generate annular illumination settings, illumination systems often have a beam transforming device.

A typical beam transforming device for an illumination system of a microlithographic exposure apparatus is disclosed in EP 747 772 A. The beam transforming device is formed by a zoom axicon objective that combines a zoom function for the continuously variable adjustment of the diameter of a light distribution and an axicon function for the radial redistribution of light intensities. The axicon system comprises two mutually axially displaceable axicon elements having mutually facing conical refractive surfaces which can be moved towards one another until they are at zero spacing. By adjusting the zoom axicon objective, it is possible to set different annular intensity distributions in an exit pupil of the zoom axicon objective and, in conventional illumination settings, different degrees of coherence. A second optical raster element, which is located in the exit pupil of the zoom axicon objective, is illuminated with the light distribution generated by the first optical raster element and the zoom axicon objective, and produces an illuminated field in the mask plane.

Illumination systems with similar beam transforming devices for the radial redistribution of light energy are described, for example, in U.S. Pat. Nos. 5,675,401, 6,377,336 and 6,452,662, all assigned to the applicant. Further beam transforming devices comprising axially displaceable refractive optical elements are known from a variety of publications like U.S. Pat. Nos. 4,674,845, 4,997,250, 6,100,961, 6,377,336, 4,317,613 and GB 907 679 A, all of them comprising axially displaceable prisms or conic surfaces to change the cross-sections of the illumination light bundle.

With the recent tendency to higher throughput and shorter wavelengths, the current beam transforming devices of illumination systems suffer from several drawbacks. With the increasing demand in the performance of projection exposure apparatuses, also the demands for the illumination systems increases in almost every aspect, such as field and pupil homogeneity, pupil shape control, polarization control and reliability for high power systems With shorter wavelengths such as 193 nm, 157 nm and below, optical materials which can be used for the manufacture of lenses and other refractive optical elements are restricted. Some of them, e.g. $CaF_2$, suffer from intrinsic birefringence. Other materials, such as $SiO_2$, suffer from light induced birefringence effects. Furthermore, all materials need to be of high homogeneity and are thus expensive. Therefore it is advantageous to reduce the amount of transparent material in an illumination system.

A drawback of current illumination systems is further given by the restricted optical performance at higher numerical apertures. As the numerical aperture of projection optical systems ever and ever increases—numerical apertures of about NA>1.4 at wafer level are already under discussion—, also the maximum propagation angle of light rays with respect to the optical axis in the illumination system increases. This particularly makes the design of the beam transforming devices in such illumination systems more difficult.

Beam transforming devices of illumination systems transform the spatial distribution of the illumination light. In the ideal case, beam transforming devices thereby do not influence the angular distribution. With the spatial distribution of illumination light here the shape of the effective light source is described, which is imaged into the entrance pupil of the projection optical system. As has already been mentioned, size and shape of the effective light source, i.e. the angular distribution of the light in the mask plane, has a major impact on the imaging properties and the process control of the projection exposure apparatus. So far, beam transforming devices comprising refractive or reflective optical components suffer from the limited field invariance of the angular spectrum of the beam transformation, or, in other words, from the limited field invariance of the effective light source. Every field point in a field plane has to be illuminated, for example after scan integration, by identical imaging conditions and therefore also by identical illumination conditions determined by identical effective light source images for every field point.

The known double axicon or double prism beam transforming devices described above, however, create different effective light source distributions for different field points. This so-called axicon effect arises from the finite angular spectrum of light propagating through the axicon pair. For a perfect collimated bundle that propagates parallel to the optical axis, an axicon or prism pair perfectly transforms an incident parallel bundle in an exit parallel bundle of different spatial cross section. For a tilted bundle of rays, however, the effect of prism or axicon pairs on the spatial distribution becomes a complicated function of the distance of the prism or axicon pairs, and thus the spatial cross section of the bundle depends on the angle of the bundle formed to the optical axis and on the transformation of the cross-section of the illumination light.

In illumination systems for EUV microlithographic exposure apparatuses, refractive optical elements such as lenses, prisms or axicon elements, cannot be used because the available materials are not transparent for wavelengths in the range between 11 nm and 14 nm that are discussed in connection with EUV lithography.

U.S. Pat. No. 6,452,661 B1 discloses a purely reflective illumination system for an EUV projection exposure apparatus. The illumination system comprises a collimating mirror that collimates a diverging light bundle produced by a radiation source and directs this collimated light bundle onto an adjustable annular light beam converting unit. This unit converts the parallel light beam having a circular cross-section to a light beam having an annular (i.e. ring-shaped) cross-section. To this end, the light beam converting unit comprises a first reflecting member with a ring-shaped reflecting surface and a second reflecting member having a conical reflecting surface. To vary the ratio to the inner diameter of the ring to the outer diameter of the light beam, the first reflecting member and the second reflecting member are moved relative to one another.

There are various other purely reflective beam transforming devices known in the art. However, these devices are not adapted to the requirements of illumination systems for microlithographic exposure apparatuses, and in particular not suitable for being used in an EUV illumination system. For example, in a purely reflective EUV illumination system the angles of incidence have to be kept within certain ranges because only then reflectivities of more than 65% can be obtained with the current technology.

For example, U.S. Pat. No. 1,988,946 describes a diaphragm system for a microscope condenser. The condenser comprises two coaxial pairs of reflectors, wherein each pair consists of a male-cone and an female-cone reflector. The two pairs lie opposite each other and include means for axially displacing the two male-cones. This diaphragm system is arranged in a path of collimated light and makes it possible to vary the diameter of the parallel light bundle and to transform it into an emerging bundle having an annular shape.

U.S. Pat. No. 804,996 discloses a telescope comprising two reflective and rotationally symmetric mirrors. Parallel light is directed by the first mirror in such a way onto the second mirror that it emerges from the second mirror again as parallel light, but with a reduced diameter.

Purely reflective optical collectors without a beam transformation effect are disclosed, for example, in U.S. Pat. No. 3,817,605. This document relates to a device for converging sunlight beams so to be able to ignite a fire or do solar cooking. The device consists of two nested rotationally symmetric curved mirrors that converge parallel sunlight to a focal point.

U.S. Pat. No. 2,198,014 describes a headlight for motor vehicles in which light produced by lamp is collected and collimated by two nested rotationally symmetric mirrors having curved mirror surfaces.

WO 2005/031748 A1 and US 2003/0043455 A1 describe collectors for EUV illumination systems that efficiently transform large aperture angles produced by a radiation source into smaller aperture angles that can be reduced to zero by a subsequent collimator mirror.

SUMMARY OF THE INVENTION

It is a first object of the present invention to provide a beam transforming device for an illumination system of a microlithographic exposure apparatus that reduces the axicon effect described above.

It is a further object of the present invention to provide a beam transforming device that is particularly adapted to the requirements of EUV illumination systems, wherein the device makes it possible to efficiently produce an annular beam cross-section.

According to a first aspect of the invention, this is achieved by an illumination system of a microlithographic exposure apparatus comprising an optical axis and a beam transforming device. The latter comprises a first mirror including a first reflective surface with a shape that is defined by rotating a straight line, which is inclined with respect to the optical axis, around the optical axis. The beam transforming device further comprises a second mirror with a second reflective surface having a shape that is defined by rotating a curved line around the optical axis. At least one of the mirrors has a central aperture containing the optical axis.

According to an advantageous embodiment, an actuator for changing the spatial relationship between the first mirror and the second mirror is provided. This actuator may be manually driven or electrically driven, for example. The beam transforming device may be configured to transform an energy distribution of a collimated light bundle. Alternatively, the beam transforming device may also have a collimating effect such that a diverging light bundle is transformed into a collimated light bundle.

A third mirror comprising a third reflective surface having a shape that is defined by having a straight line, which is inclined with respect to the optical axis, around the optical axis may be provided in addition to the first and second mirror. In a particularly advantageous embodiment, the second reflective surface at least substantially images the first reflective surface onto the third reflective surface. To this end, the second reflective surface may be aspherical. By imaging the first reflective surface onto the third reflective surface, the axicon effect is, at least substantially, reduced or even completely suppressed.

In another advantageous embodiment the mirrors are configured such that a first ray entering the beam transforming device parallel to the optical axis with a distance $d_1$ emerges from the beam transforming device parallel to the optical axis with a distance $d'_1$. A second ray entering the beam transforming device parallel to the optical axis with a distance $d_2 > d_1$ emerges from the beam transforming device parallel to the optical axis with a distance $d'_2 > d'_1$. This has the advantage that the light bundle is not inverted. This implies, in particular, that main rays are not transformed into marginal rays by the beam transforming device, and vice versa.

In another advantageous embodiment, which is particularly suited for EUV projection exposure apparatuses, the second mirror collimates a diverging light bundle into a collimated light bundle. This collimated light bundle may be directed onto the first mirror that may have a conical shape. By changing the axial distance between the two mirrors, it is possible to modify the cross-section of the emerging light bundle. This results in a purely reflective illumination system comprising a zoom-collimator that transforms a diverging light bundle into a collimated light bundle of variable shape, in particular variable diameter or variable annularity. In the prior art (see U.S. Pat. No. 6,452,661 B1), such a function has been split up into two different sub-systems, namely a collimator mirror and a beam transforming device comprising at least two distinct mirrors arranged in a collimated beam path.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
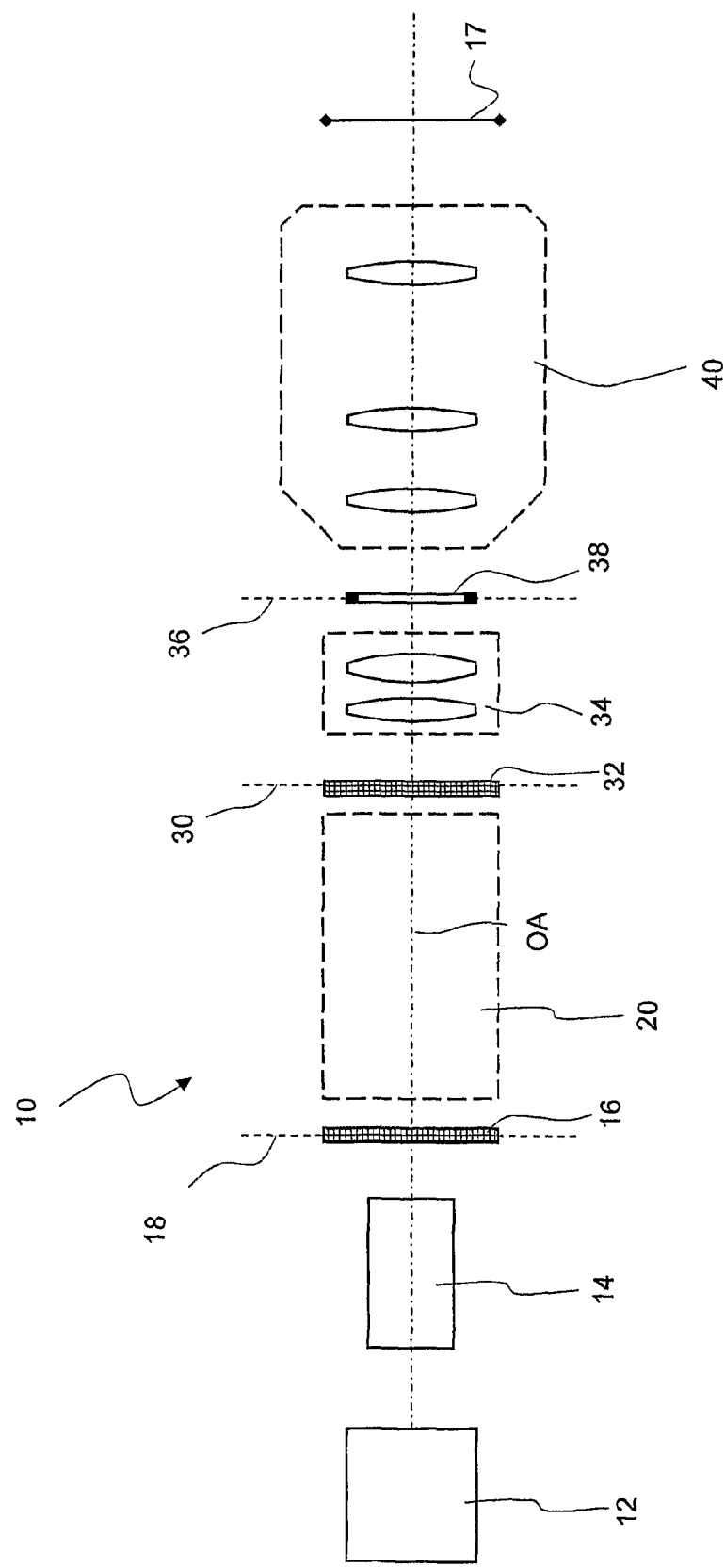
FIG. 1 shows, in a considerably simplified meridional section, an illumination system of a DUV microlithographic projection exposure apparatus.

FIG. 1 shows in a simplified meridional section an illumination system of a microlithographic exposure system. The illumination system, which is denoted in its entirety by 10, comprises a light source 12. In this embodiment, the light source 12 generates a projection light bundle having a wavelength in the deep ultraviolet spectral range, e.g. 193 nm or 157 nm.

In a beam expander 14, which may be realized as an adjustable mirror arrangement, the light bundle generated by the light source 12 is expanded into a rectangular and substantially collimated light bundle. The expanded light bundle then passes through a first optical raster element 16, which may be realized, for example, as a diffractive optical element. The first optical raster element 16 has the effect of altering the angular distribution of the projection light illuminating a mask 17.

The first optical raster element 16 is arranged in an object plane 18 of a beam transforming device 20, which is arranged in or in close proximity of a pupil plane of the illumination system 10. By modifying the cross-section of the projection light bundle, it is thus possible to further modify and continuously adjust the angular distribution of the projection light illuminating the mask 17. Various embodiments of the beam transforming device 20 are explained in more detail below with reference to FIGS. 2 to 6.

A second optical raster element 32 is arranged in a pupil plane 30, which is the exit pupil of the beam reshaping objective 20. The second optical raster element 32 defines the intensity distribution in the mask plane.

A second objective 34 is arranged behind the second optical raster element 32, as seen in the light propagation direction. In the image plane 36 of the second objective 34 a masking device 38 is arranged. The masking device 38 may have adjustable blades and is often referred to as REMA (REticle MAsking) diaphragm. The masking device 38 determines the shape of illuminated field on the mask 17.

In order to achieve sharp edges of this field, a third objective 40 is provided. In the object plane of the third objective 40 the blades of the masking device 38 are arranged, and in the image plane of the third objective 40 the mask 17 is positioned by means of a mask stage.

If required, a glass rod for beam homogenization may be inserted between the second objective 34 and the masking device 38. Apart from the beam transforming device 20, the illumination system 10 described so far is known in the art, see, for example, U.S. Pat. No. 6,285,443, assigned to the applicant.

Figure 2A:
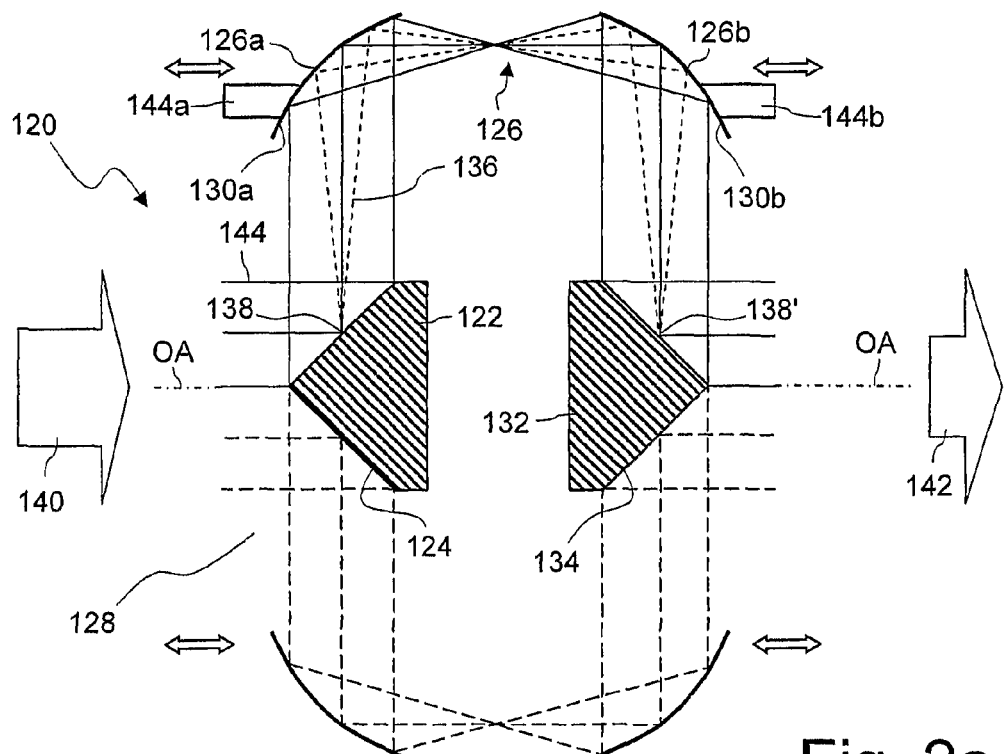
FIG. 2a shows a simplified cross-section of a beam transforming device for the illumination system shown in FIG. 1 according to a first exemplary embodiment of the invention.

FIG. 2a shows a first embodiment of a beam transforming device 20 which is denoted in its entirety by 120. The beam transforming device 120, which is shown in a meridional section, comprises a first mirror 122 having a conical reflective surface 124. The reflective surface 124 may be described by rotating a straight line, which is inclined with respect to an optical axis OA of the illumination system 10 by an angle of 45°, around the optical axis OA. This results in a conical, rotationally symmetric shape of the reflective surface 124, wherein the axis of symmetry of the cone coincides with the optical axis OA.

The beam transforming device 120 further comprises a second mirror 126 which is, in the embodiment shown, divided into two parts which will be referred to as entrance side second mirror 126a and exit side second mirror 126b. The second mirror 126 has a central orifice 128 that contains the optical axis OA. The diameter of the orifice 128 corresponds to the maximal optical free diameter of an incoming light bundle.

Reflective surfaces 130a, 130b of the entrance side second mirror 126a and exit side second mirror 126b, respectively, may be described by rotating a curved line, which does not intersect the optical axis OA, around the optical axis OA. This results in a toroidal shape of both second mirrors 126a, 126b. Since, in the embodiment shown, the curved lines whose rotations define the shape of the reflective surfaces 130a, 130b are neither straight nor circular, the reflective surfaces 130a, 130b both have an aspherical shape.

The shape of the reflective surfaces 130a, 130b is determined in such a way that the reflective surface 124 of the first mirror 122 is imaged on a third mirror 132 that has also a conical reflective surface 134. The third mirror 132 has the same configuration as the first mirror 122 except that the conical reflective surface 124 points towards the opposite side. The imaging function of the second mirror 126 is indicated in FIG. 2a by broken lines 136 that represent a light bundle emerging from a point 138 on the first mirror 122, wherein this point 138 is imaged on an image point 138' on the third mirror 132.

If the beam transforming device 120 is centered in a bundle of collimated projection light, which is indicated in FIG. 2a by an arrow 140, the beam transforming device 120 ensures that an emerging light bundle 142 is still perfectly collimated. This is indicated by a number of representative rays 144 that illustrate the optical effect of the beam transforming device 120 for collimated light.

Figure 2B:
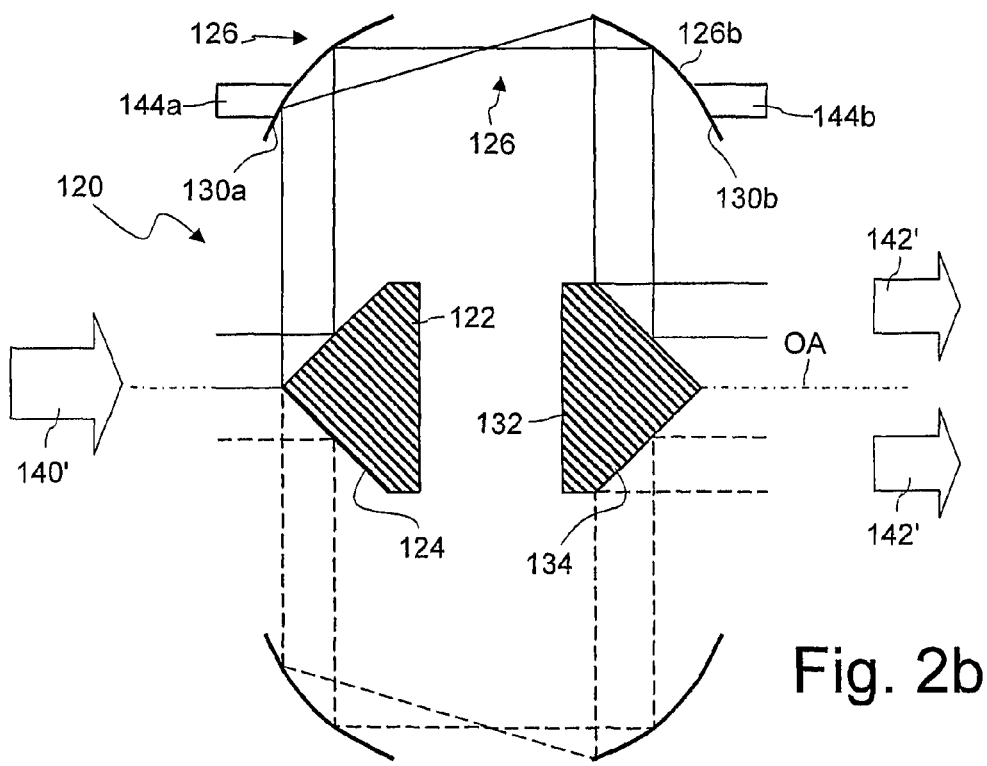
FIG. 2b shows the beam transforming device of FIG. 2a with a different diameter of the impinging light bundle.

If the first mirror 122 is illuminated only partially, as is shown in FIG. 2b, the emerging light bundle 142' has an annular cross-section which corresponds to an annular illumination setting.

The curvatures of the second mirror 126 are determined such that the magnification of the image formed on the third mirror 132 equals one in the initial configuration shown in FIG. 2a. For that reason the width of the annulus, which describes the cross-section of the emerging light bundle 142', equals one half of the diameter of the incoming light bundle 140'. If required, the magnification may be varied by changing the shape of the second mirror 126.

If the entrance side second mirror 126a and the exit side second mirror 126b are mounted in such a way that they can be independently displaced along the optical axis OA, it is possible to adjust the annularity of the annular setting. In general the entrance and exit side mirrors 126a, 126b have to be displaced by different distances in order to achieve the desired modification of the annularity. Due to the change of the effective reflective areas (intersection distance) with the movement of the mirrors, this will result in a variation of the magnification. Thus displacing the mirrors 126a, 126b does not only adjust the annularity, but also the diameter of the emerging light bundle.

By displacing the second mirrors 126a, 126b along the optical axis OA, also a conventional setting may be achieved, but with generally different diameters of the incoming light bundle 140 and the emerging light bundle 142.

The imaging effect of the second mirror 126 ensures that the axicon effect is considerably reduced. To be more specific, the spatial energy redistribution is not significantly affected if the impinging light bundle is not exactly collimated. In the illumination system 10 shown in FIG. 1, this situation occurs because the first optical raster element 16 introduces a divergence so that the light impinging on the beam transforming device 120 is not collimated.

Figure 3A:
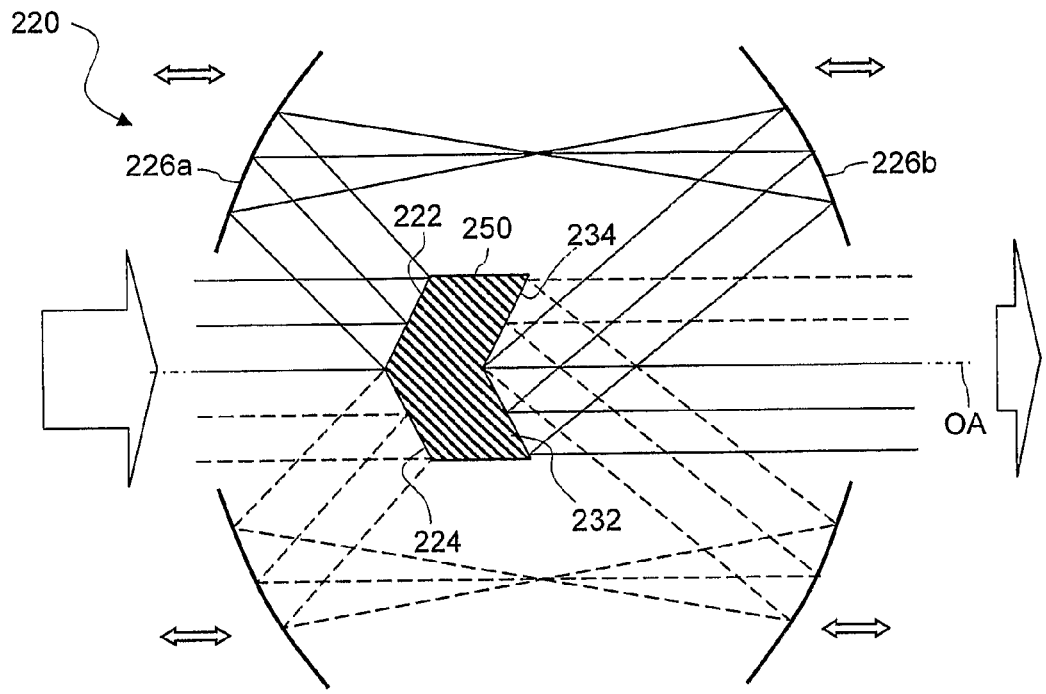
FIG. 3a shows a simplified cross-section of a beam transforming device for the illumination system shown in FIG. 1 according to a second exemplary embodiment of the invention.

FIG. 3a shows, in a representation similar to FIG. 2a, a second embodiment for a beam transforming device which is denoted in its entirety by 220. The main difference to the first embodiment shown in FIGS. 2a, 2b is that the reflective surface 234 of the third mirror is again conical, but is formed on the inner surface of a cone pointing towards the entrance side of the beam transforming device 220. This results in a concave conical shape of the reflective surface 234. Apart from that, the first mirror 222 and the third mirror 232 have a common mirror support 250, and the curvatures of the second mirror 226 and the cone angles of the first and third mirrors 222, 232 are different in comparison to the embodiment shown in FIGS. 2a, 2b.

The modified construction of the beam transforming device 220 has the advantage that a beam inversion is prevented that occurs in the beam transforming device 120. A beam inversion implies the effect that main rays become marginal rays and vice versa. A beam inversion results in a disadvantageous energy distribution and should therefore, at least in general, be avoided.

Figure 3B:
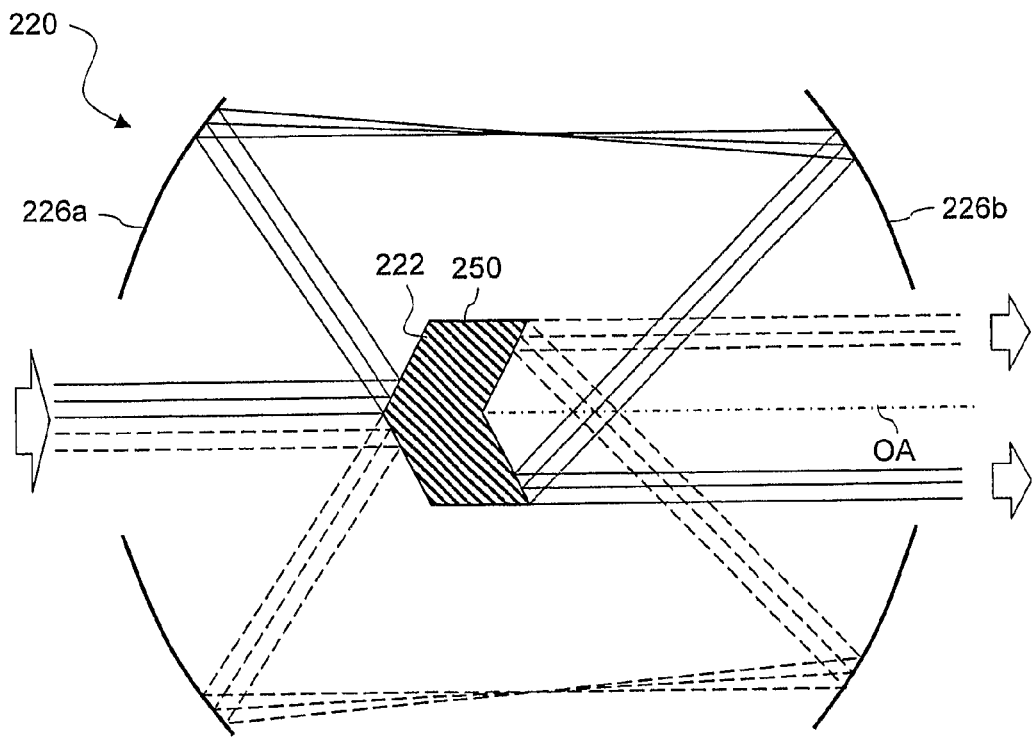
FIG. 3b shows the beam transforming device of FIG. 3a in a different zoom position.

FIG. 3b shows the effect if the first mirror 222 is illuminated only partially and the entrance side second mirror 226a and the exit side second mirror 226b have been moved apart from their initial position in which the magnification equals 1. In such a configuration, an annular illumination setting is obtained. By further moving the entrance side second mirror 226a and/or the exit side second mirror 226b, the annularity may be adjusted.

Figure 4A:
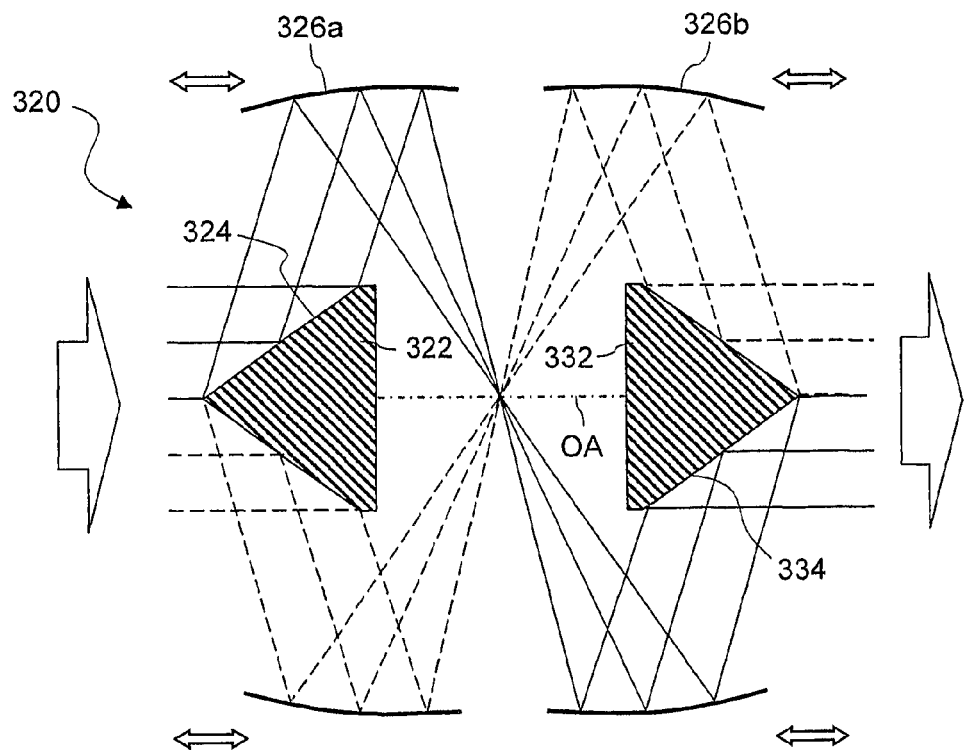
FIG. 4a shows a simplified cross-section of a beam transforming device for the illumination system shown in FIG. 1 according to a third exemplary embodiment of the invention.
Figure 4B:
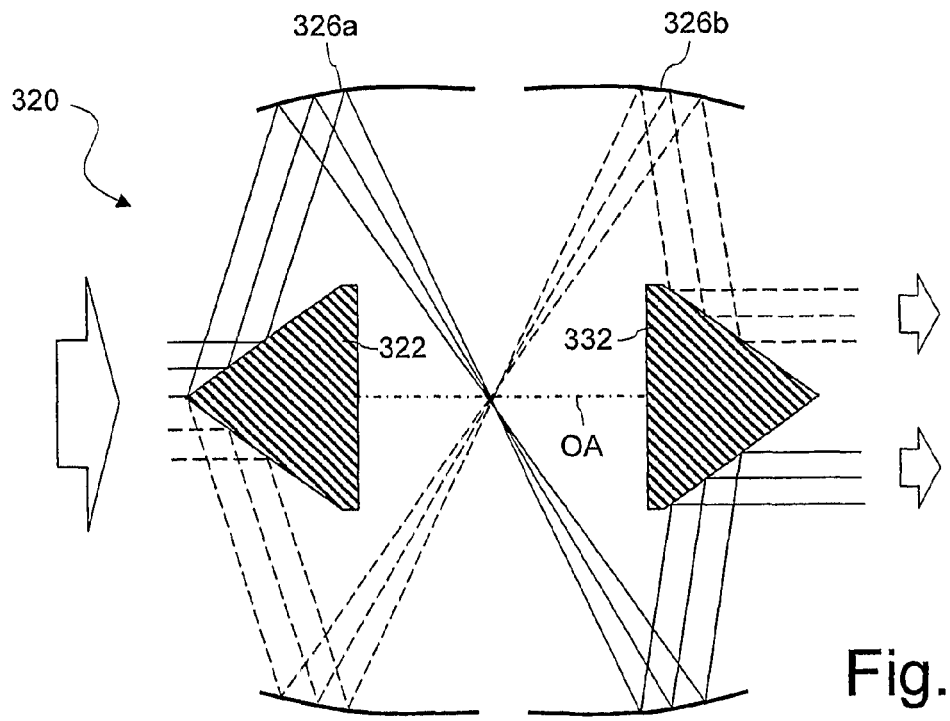
FIG. 4b shows the beam transforming device of FIG. 4a in a different zoom position.

FIGS. 4a and 4b show, in representations similar to FIGS. 2a and 2b, a third embodiment of a beam transforming device which is denoted in its entirety by 320. The beam transforming device 320 differs from the beam transforming device 120 shown in FIGS. 2a, 2b in that the focal plane of the entrance side and exit side second mirrors 326a and 326b, respectively, contains the optical axis OA. Due to this symmetric arrangement, the distances of movement of the mirrors 326a, 326b required to modify the annularity are comparatively small. Consequently, the change of the magnification caused by moving the mirrors 326a, 326b by different distances is small, too. Thus the magnification is essentially maintained, even if the mirrors 326a, 326b are displaced along the optical axis OA in order to modify the annularity.

A beam inversion is, similar to the embodiment shown in FIGS. 3a, 3b, avoided also in the beam transforming device 320.

Figure 5A:
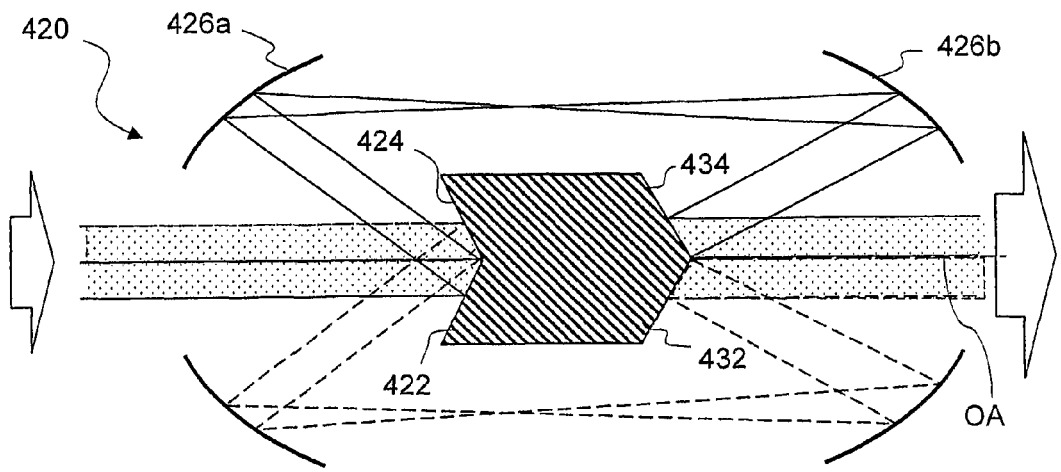
FIG. 5a shows a simplified cross-section of a beam transforming device for the illumination system shown in FIG. 1 according to a fourth exemplary embodiment of the invention.
Figure 5B:
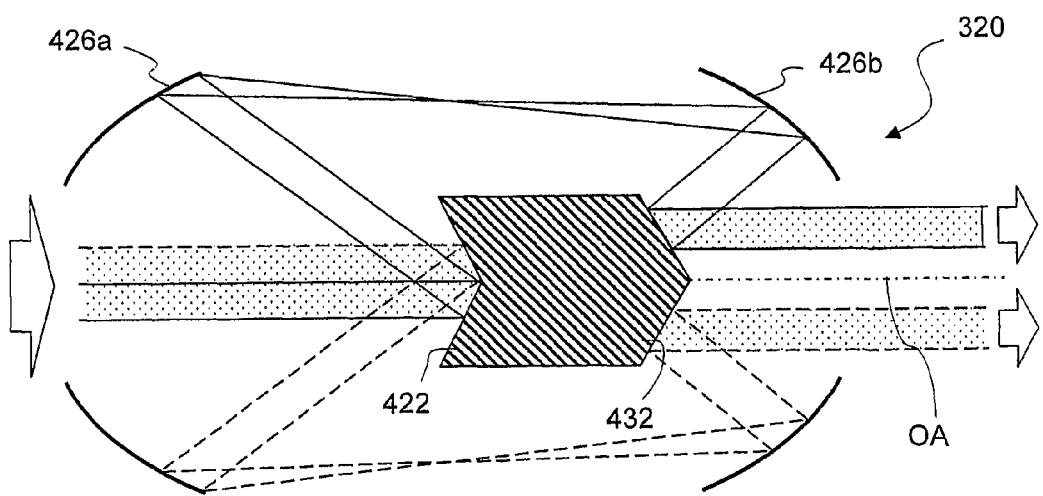
FIG. 5b shows the beam transforming device of FIG. 5a in a different zoom position.

FIGS. 5a, 5b show, in representations similar to FIGS. 3a and 3b, a fourth embodiment of a beam transforming device which is denoted in its entirety by 420. The general configuration is similar to the beam transforming device 220 shown in FIGS. 3a, 3b. However, the reflective surface 424 of the first mirror 422 is concave, and the reflective surface 434 of the third mirror 432 is convex.

FIG. 5b shows the configuration of the beam transforming device 420 after displacing the entrance side and exit side second mirrors 426a, 426b along the optical axis OA by different distances. The displacement results in an annular cross-section of the emerging light bundle. The annularity can be modified by the distances of movement of the two mirrors 426a, 426b.

Also in the beam transforming device 420 a beam inversion does not occur.

Figure 6A:
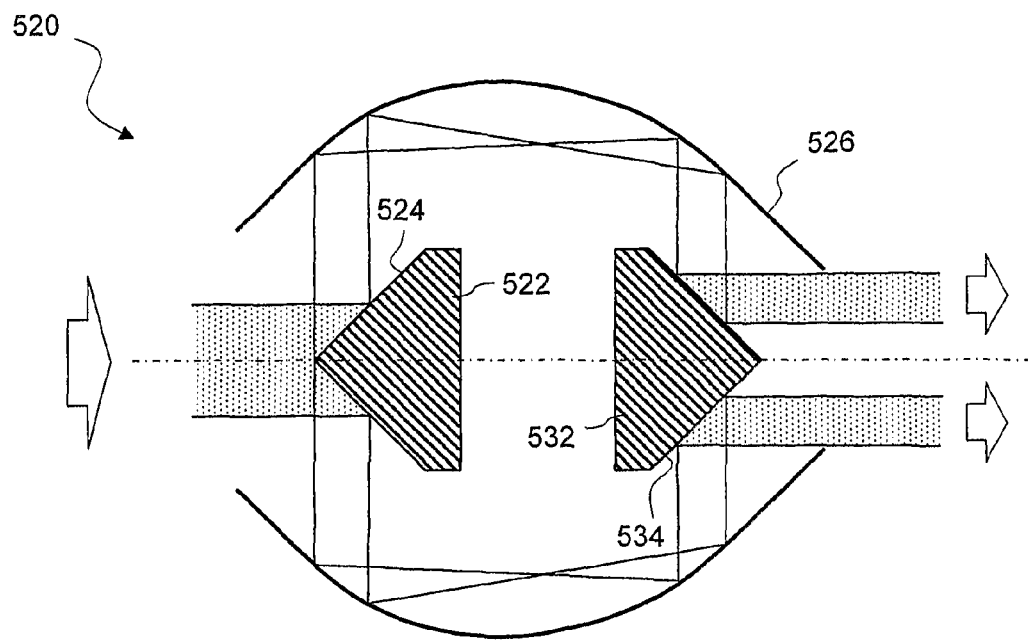
FIG. 6a shows a simplified cross-section of a beam transforming device for the illumination system shown in FIG. 1 according to a fifth exemplary embodiment of the invention.
Figure 6B:
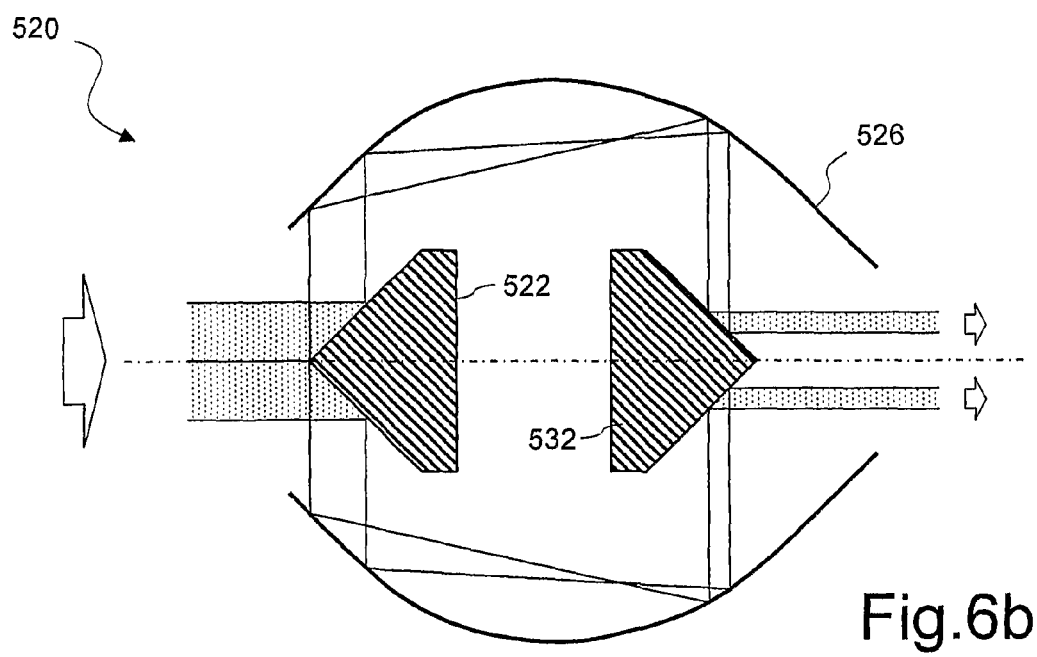
FIG. 6b shows the beam transforming device of FIG. 6a in a different zoom position.

FIGS. 6a and 6b show a fifth embodiment of a beam transforming device which is denoted in its entirety by 520. In this embodiment the second mirror 526 is not subdivided into an entrance side and an exit side mirror that can be displaced along the optical axis OA independently from each other. Instead, the mirror 526 is formed by a single barrel-shaped optical element having a cavity in which the first mirror 522 and the third mirror 532 are coaxially arranged. The second mirror 526 has a parabolic shape so that light rays that impinge on the second mirror 526 parallel to the axis of symmetry of the mirror converge to a focal point.

Figure 7:
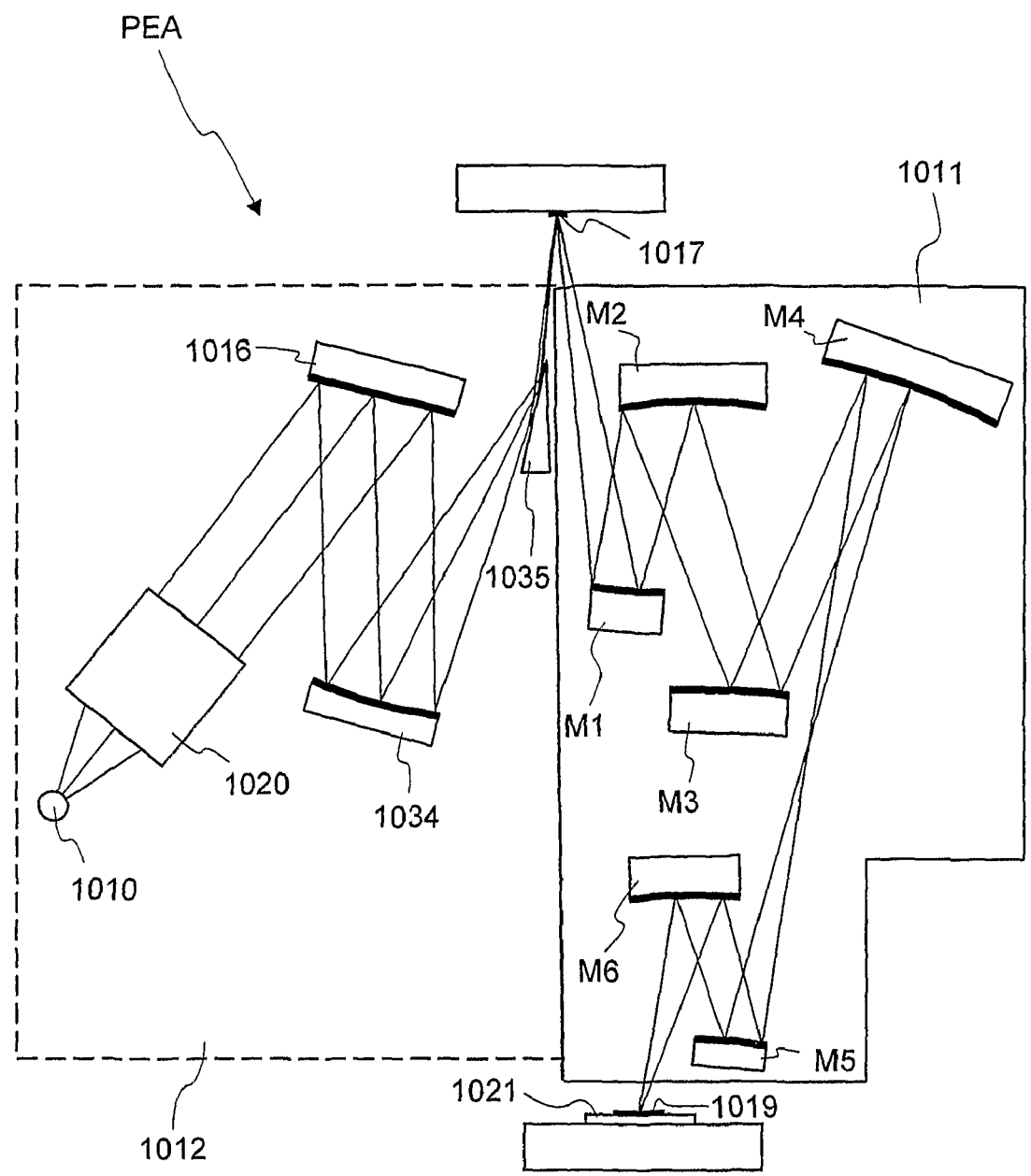
FIG. 7 shows, in a considerably simplified meridional section, an EUV microlithographic projection exposure apparatus.

FIG. 7 shows a microlithographic projection exposure apparatus that is designed for wavelengths in the extreme ultraviolet spectral range, for example λ=13.5 nm. The projection exposure apparatus, which is denoted in its entirety by PEA, comprises an illumination system 1010 and a projection objective 1011. The projection objective 1011 images a pattern contained in a reflective mask 1017 onto a light sensitive layer 1019 which is disposed on a wafer 1021. The projection objective 1011 comprises six imaging mirrors M1 to M6 that form a reduced image of the pattern contained in the mask 1017 on the light sensitive layer 1019. Since the projection objective 1011 is known in the art as such, it will not be further explained here.

The illumination system 1010 comprises a light source 1012, a beam transforming device referred to in the following as zoom collector 1020, a diffuser mirror 1016, a condenser mirror 1034 and a plane folding mirror 1035. Apart from the zoom collector 1020, the components of the illumination system 1010 are known in the art as such, see, for example, US 2003/0043455 A1 or U.S. Pat. No. 6,452,661 B1. The zoom collector 1020 collects the radiation produced by the light source 1012 and collimates the light into a parallel light bundle. Furthermore, the zoom collector 1020 is adapted to transform the radial energy distribution into an annular distribution of variable geometry.

In the following various embodiments for the zoom collector 1020 are described with reference to FIGS. 8 to 11.

Figure 8A:
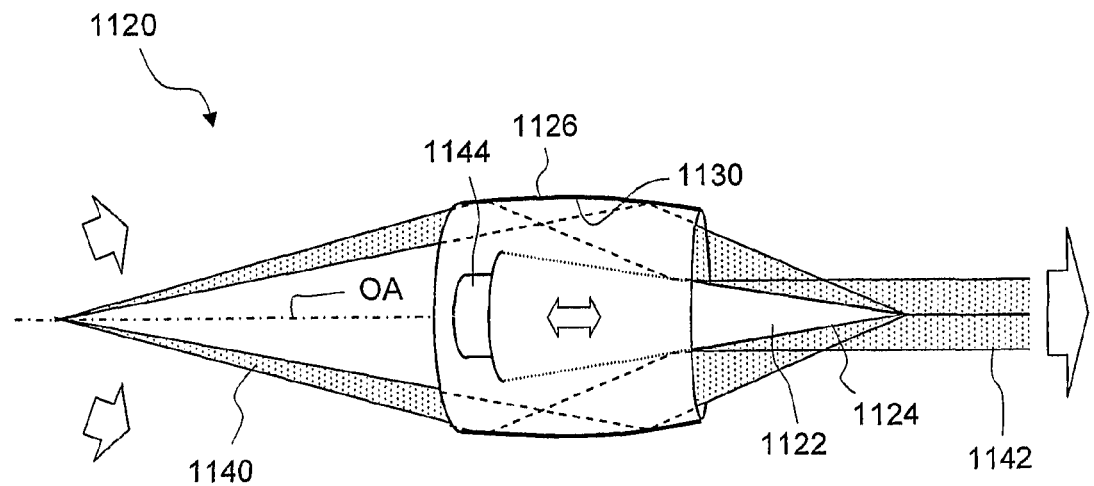
FIG. 8a shows a simplified cross-section of a beam transforming device for an illumination system of the microlithographic projection exposure apparatus shown in FIG. 7 according to a first exemplary embodiment.

FIG. 8a shows in a perspective view a first embodiment of the zoom collector which is denoted in its entirety by 1120. The zoom collector 1120 comprises a first mirror 1122 having a conical reflective surface 1124. The first mirror 1122 is configured to be displaced along the optical axis OA by means of an actuator 1144.

The zoom collector 1120 further comprises a second mirror 1126 having the shape of a toroid or a barrel. The inner surface of the barrel supports a reflective surface 1130 that may consist of a multi-layer system having a reflectivity for the projection wavelength λ of more than 60% for angles of incidence below 30° and above 70°. All reflective surfaces in this embodiment and the embodiments described further below may be formed by such multi-layer systems.

The shape of the reflective surface 1130 of the second mirror 1126 may be described by rotating a curved line, which does not intersect the optical axis OA, around the optical axis OA. The curvature of the line is determined such that a divergent annular light bundle 1140, which is produced by the light source 1010, is collimated and directed towards the first mirror 1122. The conical reflective surface 1124 of the first mirror 1122 deviates the annular collimated light bundle produced by the barrel-shaped mirror 1126 such that emerges from the zoom collector 1120 as a collimated bundle 1142 parallel to the optical axis OA.

Figure 8B:
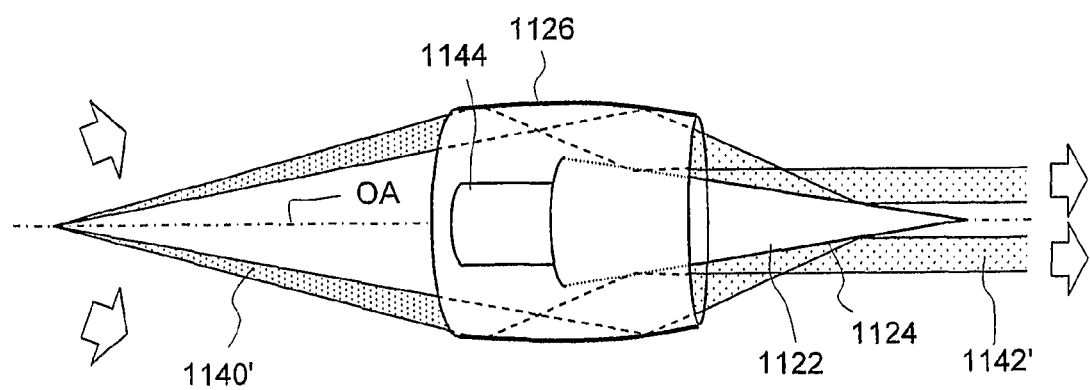
FIG. 8b shows the beam transforming device of FIG. 8a in a different zoom position.

In the configuration shown in FIG. 8a, the axial position of the first mirror 1122 is determined such that the emerging light bundle 1142 has a disc-shaped cross-section which corresponds to a conventional illumination setting. Upon displacing the first mirror 1122 along the optical axis OA towards the exit side of the zoom collimator 1120 by means of the actuator 1144, as is shown in FIG. 8b, the light bundle 1142' emerging from the zoom collector 1120 is transformed such that it has an annular cross-section. The diameter of the annulus can be continuously adjusted to a desired value. The width of the annulus, however, cannot be varied by displacing the first mirror 1122 along the optical axis OA. A variation of the width is only possible by exchanging the first mirror 1122 and/or the second mirror 1126.

Figure 9A:
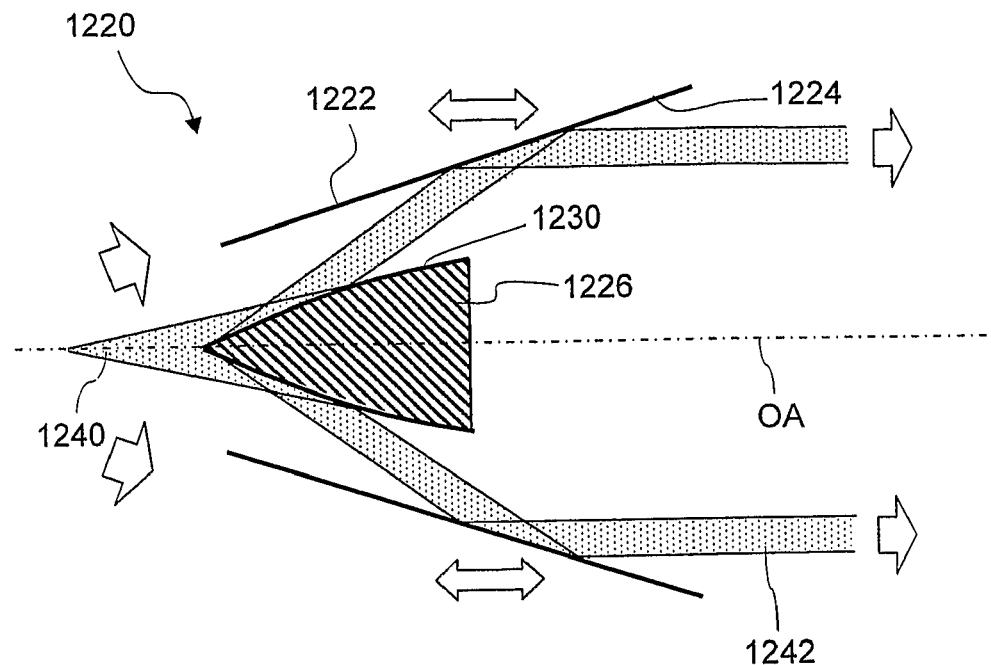
FIG. 9a shows a simplified cross-section of a beam transforming device for an illumination system of the microlithographic projection exposure apparatus shown in FIG. 7 according to a second exemplary embodiment.
Figure 9B:
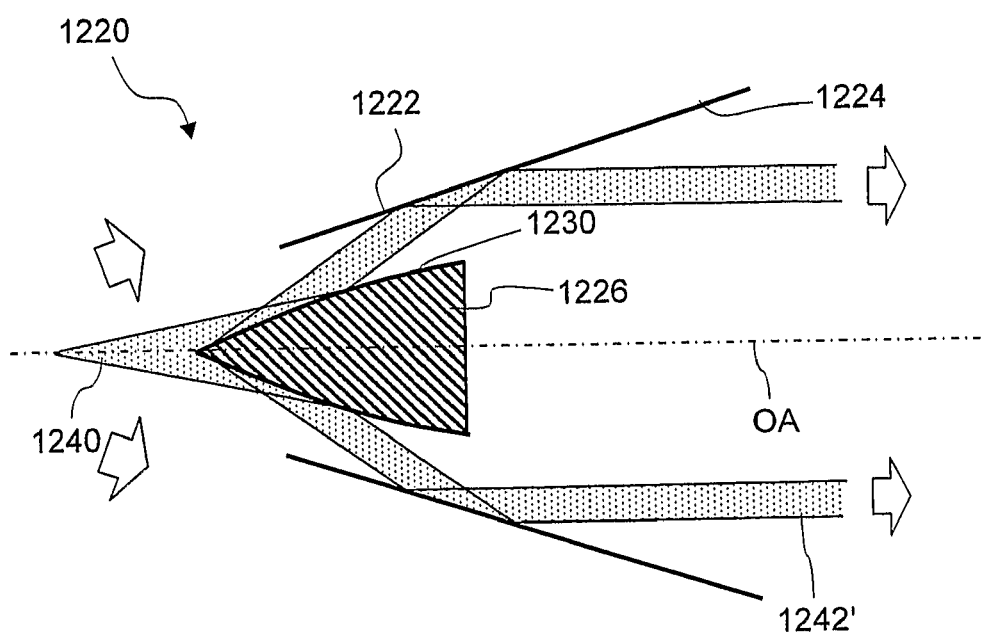
FIG. 9b shows the beam transforming device of FIG. 9a in a different zoom position.

FIGS. 9a and 9b show cross-sections of a second embodiment of a zoom collimator, denoted in its entirety by 1220, in two different zoom configurations. In this embodiment the first mirror 1222 having a conical reflective surface 1224 comprises a frusto-conical support element supporting on its inside the reflective surface 1224. Within the first mirror 1222 the second mirror 1226 is received. The second mirror 1226 has, as in the other embodiments, a reflective surface 1230 that can be described by rotating a curved line around the optical axis OA. This reflective surface 1230 has an aspherical shape and collimates an impinging divergent light bundle 1240 into an annular collimated light bundle that is directed onto the reflective surface 1224 of the first mirror 1222. The first mirror 1222 deflects the annular light bundle such that it emerges from the zoom collimator 1220 parallel to the optical axis OA.

By adjusting the axial position of the first mirror 1222, the diameter of the annular energy distribution on the exit side of the zoom collector 1220 can be modified, as is shown in FIG. 9b.

Figure 10:
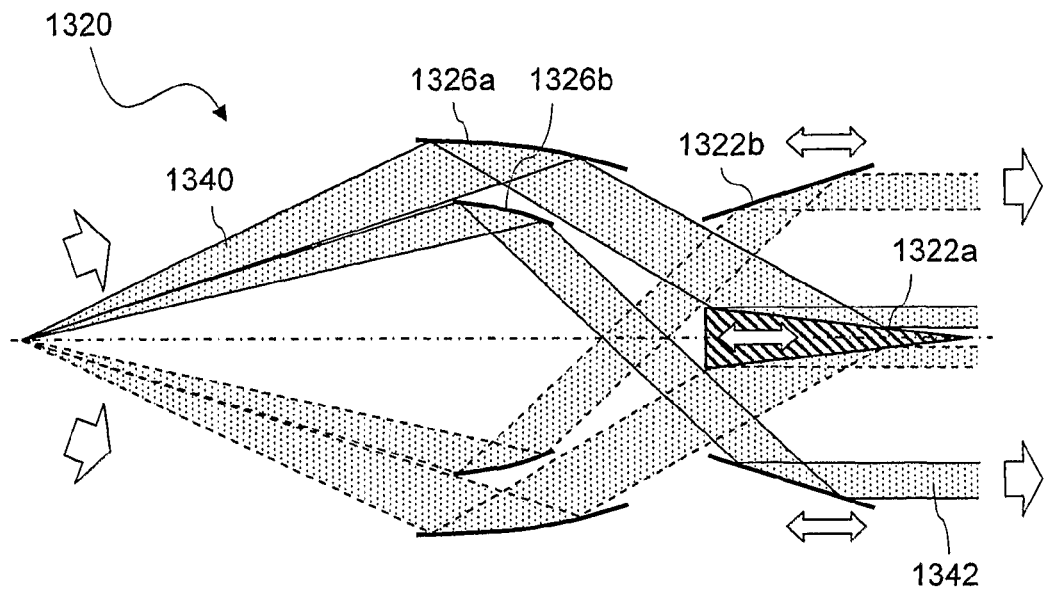
FIG. 10 shows a simplified cross-section of a beam transforming device for an illumination system of the microlithographic projection exposure apparatus shown in FIG. 7 according to a third exemplary embodiment.

FIG. 10 shows a third embodiment of a zoom collector which is denoted in its entirety by 1320. The zoom collector 1320 comprises two coaxial pairs of first and second mirrors that are nested in each other. Each pair of mirrors collects, collimates and transforms a part of a diverging annular entrance light bundle 1340 into a collimated (annular) light bundle. To be more specific, a first pair comprises an arrangement as is shown in FIG. 8a, i.e. a first conical mirror 1322a and a second toroidal aspherical mirror 1326a. The second pair comprises a first toroidal conical mirror 1322b and a second toroidal aspherical mirror 1326b. By axially displacing the first conical mirror 1322a of the first pair, it is possible to produce a conventional illumination setting or an annular illumination setting with varying annular diameter. The second pair of mirrors 1322b, 1326b produces a collimated annular light bundle having a diameter that can be varied by axially displacing the first toroidal conical mirror 1322b.

Figure 11:
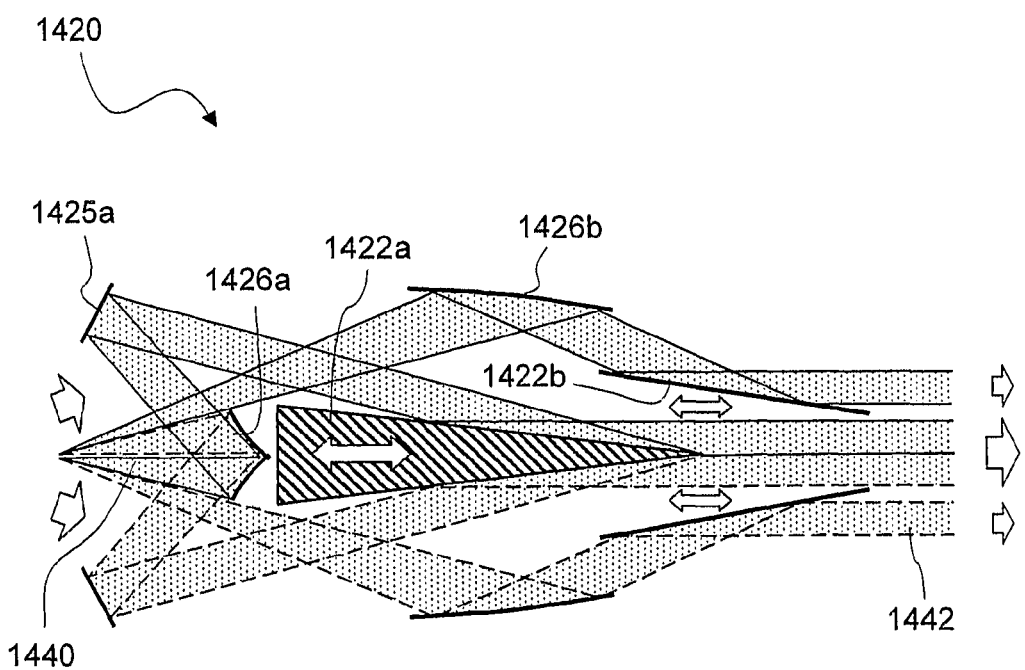
FIG. 11 shows a simplified cross-section of a beam transforming device for an illumination system of the microlithographic projection exposure apparatus shown in FIG. 7 according to a fourth exemplary embodiment.

FIG. 11 shows a fourth embodiment of a zoom collector which is denoted in its entirety by 1420. Similar to the third embodiment shown in FIG. 10, the zoom collector 1420 comprises a first pair of mirrors 1422a and 1426a and a second pair of mirrors 1422b and 1426b. By arranging the second mirror 1426a of the first pair in the center of the zoom collector 1420 and by providing an additional toroidal conical mirror 1425a, the same functionality is obtained as in the zoom collector 1320 shown in FIG. 10, but now for light sources that produce not an annular light bundle, as is shown in FIG. 10, but a diverging light bundle 1440 having a disc-shaped cross-section.

Figure 12A:
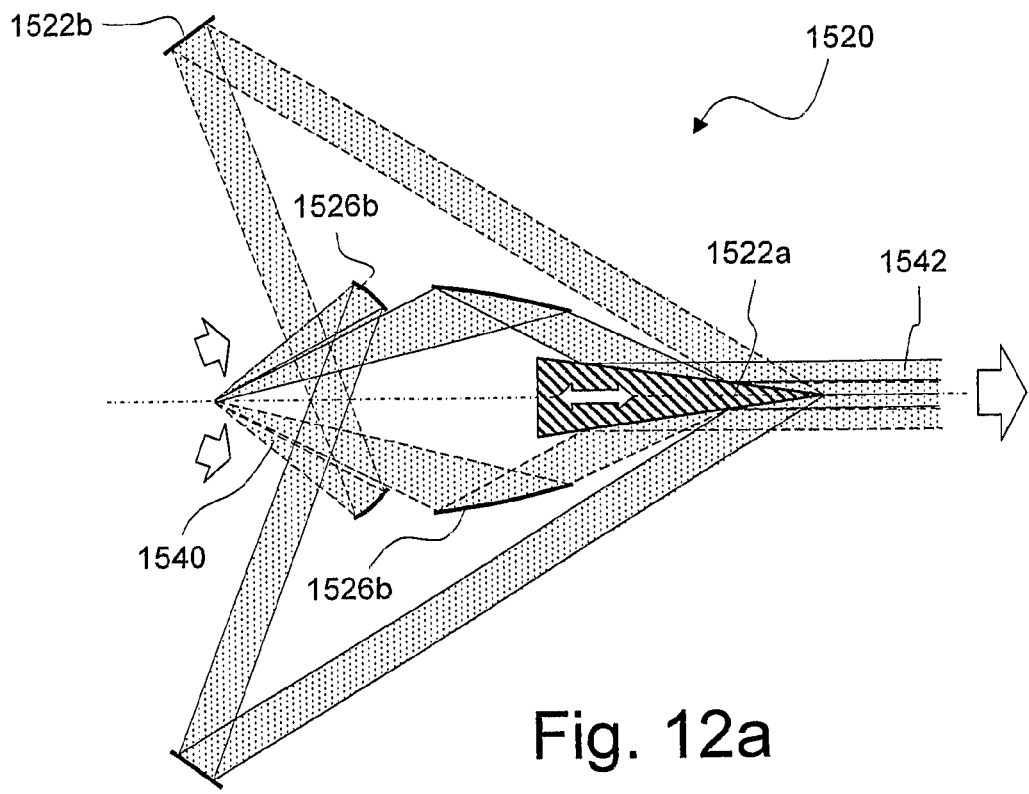
FIG. 12a shows a simplified cross-section of a beam transforming device for an illumination system of the microlithographic projection exposure apparatus shown in FIG. 7 according to a fifth exemplary embodiment.
Figure 12B:
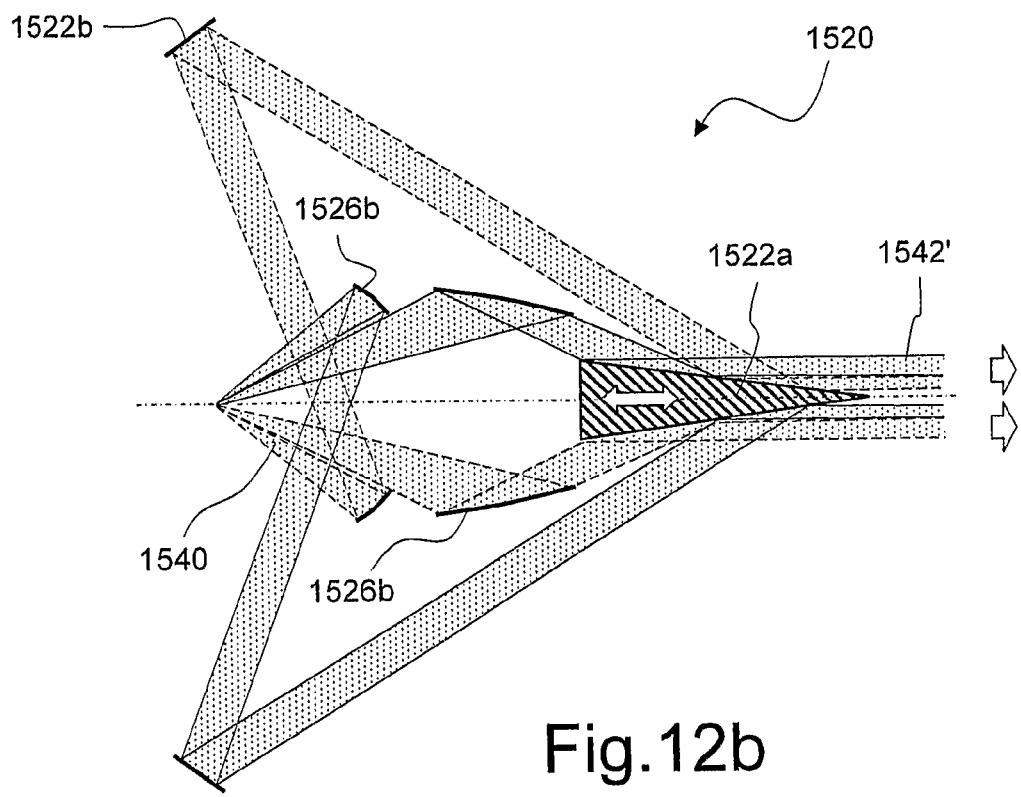
FIG. 12b shows the beam transforming device of FIG. 12a in a different zoom position.

FIGS. 12a and 12b show a fifth embodiment of a zoom collector, which is denoted in its entirety by 1520, in two different zoom configurations. The zoom collector 1520 makes it possible to transform an annular diverging light bundle 1540 either into a disc-shaped collimated light bundle (conventional illumination setting), as is shown in FIG. 12a, into an annular collimated light bundle (annular illumination setting), as is shown in FIG. 12b, and also into a collimated light bundle with a cross-section comprising a central disc and an annulus surrounding the disc. Such a light bundle may be useful, in conjunction with an additional diaphragm, for producing a c-quad illumination setting, for example.

To this end, the zoom collector 1520 comprises again two pairs of first and second mirrors 1522a, 1526a and 1522b, 1526b, respectively. By axially displacing the first mirror 1522b of the second pair, it is possible to vary the distance between the inner disc/annulus and the outer annulus in the cross-section of the emerging light bundle nulus in the cross-section of the emerging light bundle 1542. By axially displacing the conical first mirror 1522a of the first pair, it is possible to commonly increase or decrease the diameters of the separate annular light bundles produced by each pair of mirrors.

In the configuration shown in FIG. 12b, the axially displaceable conical mirrors 1522a, 1522b are arranged in such a way that an annular energy distribution is produced on the exit side of the zoom collector 1520. If the first mirror 1522b of the second pair is displaced in the direction towards the entry side of the zoom collector 1520, the inner annulus shrinks until the inner diameter approaches zero, resulting in a disc-shaped energy distribution.

The invention claimed is:

1. An illumination system of an extreme-ultraviolet microlithographic exposure apparatus, having an optical axis and comprising a non-refractive zoom-collimator configured to transform a diverging extreme ultraviolet light bundle into a collimated light bundle of variable shape, wherein said zoom-collimator comprises:
    a) a first reflective optical element,
    b) a second reflective optical element, wherein
    c) the first reflective optical element receives the diverging light bundle and directs the received light bundle onto the second reflective optical element, and
    d) at least one of the reflective optical elements is mounted for being fixed at different axial positions along the optical axis.

2. The illumination system of claim 1, wherein the first reflective optical element collimates the divergent light bundle and directs it onto a conical section of the second reflective optical element.

3. A microlithographic exposure apparatus, comprising an illumination system as claimed in claim 1.

4. A microlithographic method of fabricating a microstructured device, comprising:
    a) providing a substrate supporting a light sensitive layer;
    b) providing a mask containing structures to be imaged onto the light sensitive layer;
    c) providing a microlithographic exposure apparatus according to claim 3;
    d) projecting at least a part of the mask onto the light sensitive layer.

5. The illumination system of claim 1, comprising an actuator for changing the spatial relationship between the first reflective optical element and the second reflective optical element.

6. The illumination system of claim 1, wherein the first reflective optical element comprises two separate members.

7. The illumination system of claim 1, wherein the zoom-collimator is non-inverting.

8. The illumination system of claim 1, wherein the first reflective optical element comprises a first reflective surface having a shape that is defined by rotating a curved line around the optical axis.

9. The illumination system of claim 1, wherein the second reflective optical element is at least partly received in a cavity formed within the first reflective optical element.

10. The illumination system of claim 1, wherein the first reflective optical element is at least partly received in a cavity formed within the second reflective optical element.

11. The illumination system of claim 1, comprising:
    a first pair of first and second reflective optical elements, and
    a second pair of first and second reflective optical elements.

12. The illumination system of claim 1, comprising a light source which is configured to produce projection light having a wavelength $\lambda < 15$ nm.

13. The illumination system of claim 8, wherein the first reflective surface is aspherical.

14. An extreme-ultraviolet illumination system, having an optical axis and comprising a non-refractive zoom-collimator configured to transform a diverging extreme ultraviolet light bundle into a collimated light bundle of variable shape, wherein said zoom-collimator comprises:
    a) a first reflective optical element,
    b) a second reflective optical element, wherein
    c) the first reflective optical element receives the diverging light bundle and directs the received light bundle onto the second reflective optical element, and
    d) at least one of the reflective optical elements is mounted for being fixed at different axial positions along the optical axis.

15. The illumination system of claim 14, further comprising an actuator configured to alter a spatial relationship between the first reflective optical element and the second reflective optical element.

16. The illumination system of claim 14, wherein the second reflective optical element is at least partly received in a cavity formed within the first reflective optical element.

17. The illumination system of claim 14, wherein the first reflective optical element is at least partly received in a cavity formed within the second reflective optical element.

18. A beam transforming device, comprising:
a non-refractive zoom-collector configured to transform a diverging bundle of extreme-ultraviolet light into a collimated light bundle of variable shape,
wherein said zoom-collector comprises a first reflective optical element and a second reflective optical element defining an optical axis,
wherein the first reflective optical element is configured to receive the diverging light bundle and to direct the received light bundle onto the second reflective optical element, and
wherein at least one of the reflective optical elements is configured to mount at plural positions along the optical axis.

19. The device according to claim 18, further comprising an actuator configured to alter a spatial relationship between the first reflective optical element and the second reflective optical element.

20. The device according to claim 18, wherein the first reflective surface is aspherical.

* * * * *

UNITED STATES PATENT AND TRADEMARK OFFICE
CERTIFICATE OF CORRECTION

PATENT NO. : 8,134,687 B2  Page 1 of 1
APPLICATION NO. : 11/660754
DATED : March 13, 2012
INVENTOR(S) : Wolfgang Singer et al.

It is certified that error appears in the above-identified patent and that said Letters Patent is hereby corrected as shown below:

Column 2, Line 54: delete "systems With" and insert -- systems. With --

Column 12, Line 52: In Claim 14, delete "zoom- collimator" and insert -- zoom-collimator --

Column 13, Line 6: In Claim 18, delete "extreme- ultraviolet" and insert -- extreme-ultraviolet --

Signed and Sealed this
Eleventh Day of December, 2012

David J. Kappos
*Director of the United States Patent and Trademark Office*